United States Patent
Chen et al.

(10) Patent No.: US 6,980,780 B2
(45) Date of Patent: Dec. 27, 2005

(54) POWER CONTROLLER

(75) Inventors: Chieh-Sheng Chen, Tainan (TW); Keng-Li Su, Hsinchu (TW)

(73) Assignee: Media Tek Inc., Hsin Chu (TW)

( * ) Notice: Subject to any disclaimer, the term of this patent is extended or adjusted under 35 U.S.C. 154(b) by 775 days.

(21) Appl. No.: 09/855,511

(22) Filed: May 16, 2001

(65) Prior Publication Data

US 2002/0137481 A1  Sep. 26, 2002

(51) Int. Cl.$^7$ ............................... H04B 1/04
(52) U.S. Cl. .............. 455/127.1; 455/127.3; 455/343.1; 455/115.1; 330/51
(58) Field of Search ............. 455/127.2, 127.3, 455/127.1, 115.1, 115.3, 522, 343.1, 343.2, 455/343.5, 127.5, 115.4, 571; 330/51, 124 D, 330/296

(56) References Cited

U.S. PATENT DOCUMENTS

| | | | | |
|---|---|---|---|---|
| 5,023,569 A | * | 6/1991 | Raven | 330/51 |
| 5,303,395 A | * | 4/1994 | Dayani | 455/571 |
| 5,574,993 A | * | 11/1996 | Kobayashi et al. | 455/127.1 |
| 5,757,235 A | * | 5/1998 | Fujiwara et al. | 330/296 |
| 5,831,479 A | * | 11/1998 | Leffel et al. | 330/124 D |
| 5,903,854 A | | 5/1999 | Abe et al. | |
| 6,121,841 A | * | 9/2000 | Sakuno | 330/285 |
| 6,127,886 A | * | 10/2000 | Khabbaz et al. | 330/51 |
| 6,134,424 A | * | 10/2000 | Nishihori et al. | 455/127.1 |
| 6,148,220 A | | 11/2000 | Sharp et al. | |
| 6,154,664 A | * | 11/2000 | Chorey et al. | 455/127.3 |
| 6,215,987 B1 | * | 4/2001 | Fujita | 455/127.3 |
| 6,240,279 B1 | * | 5/2001 | Nitta et al. | 455/127.2 |
| 6,366,788 B1 | * | 4/2002 | Fujioka et al. | 330/51 |
| 6,369,649 B2 | * | 4/2002 | Nakajima | 330/51 |
| 6,396,879 B1 | * | 5/2002 | Yoshimura et al. | 455/115.3 |
| 6,532,357 B1 | * | 3/2003 | Ichikawa | 455/127.3 |
| 6,678,507 B1 | * | 1/2004 | Kurokawa et al. | 455/127.1 |
| 6,816,714 B2 | * | 11/2004 | Toncich | 455/115.3 |
| 2001/0023177 A1 | * | 9/2001 | Tanaka | 455/73 |
| 2003/0054780 A1 | * | 3/2003 | Nunogawa et al. | 455/127.2 |

FOREIGN PATENT DOCUMENTS

| EP | 0 977 354 A1 | 2/2000 | |
|---|---|---|---|
| JP | 05291842 A | * 11/1993 | H03F 3/21 |
| WO | WO 99/30426 A1 | 6/1999 | |

* cited by examiner

Primary Examiner—Lana Le
(74) Attorney, Agent, or Firm—Birch, Stewart, Kolasch & Birch, LLP

(57) ABSTRACT

An apparatus for power controlling in a transmitter for detecting the output power without using a power coupler includes a plurality of stage amplifiers, a plurality of matching circuits, at least one power detector, and a bias control circuit. The stage amplifiers receive an emission signal and amplify the power thereof. The matching circuits are connected between the stage amplifiers for matching with the stage amplifiers, respectively. The power detector detects the power of the stage amplifiers and generates detection signals, respectively. The bias control circuit receives the detection signals of the power detector, thereby generating a bias of each of the stage amplifiers in order to optimize the efficiency of each of the stage amplifiers according to the magnitude of the power of each of the stage amplifiers.

4 Claims, 3 Drawing Sheets

POWER CONTROLLER

BACKGROUND OF THE INVENTION

A. Field of the Invention

The present invention relates to a power controller, in particular, to a power controller in which a power detector, instead of a power coupler, is used for detecting the output power from each stage amplifier so as to effectively control the power and efficiency of each stage amplifier.

B. Description of the Related Art

FIG. 1 is a block diagram showing a conventional power control system. The symbol 100 refers to a GSM power controller. The function of the power controller 100 is to amplify the power of the radio frequency input signal that is emitted through an antenna 190. The power controller 100 is suitable for the power control system of the mobile phone. Referring to FIG. 1, the conventional power controller 100 includes a driver stage amplifier 110, an inter stage amplifier 120, a power stage amplifier 130, and matching circuits 140, 141, and 142 for each stage amplifier. In addition, in order to let each stage amplifier operate at a proper operating environment, the power controller 100 further includes two DC bias and analog power control circuits 150 and 151. The control circuit 150 receives a first control signal APC1 which is used for controlling the driver stage amplifier 110 and the inter stage amplifier 120. On the other hand, the control circuit 151 receives a second control signal APC2 which is used for controlling the power stage amplifier 130.

As shown in FIG. 1, the antenna 190 is used for emitting the radio frequency output signal of the power controller 100 in the power control system. At the same time, a power coupler 180 and a power detecting unit 170 are used for detecting the magnitude of the power of the radio frequency output signal. The power detecting unit 170 generates a control signal APC according to the magnitude of the output power. The control signal APC is inputted to the power controller 100 as signals APC1 and APC2, thereby controlling the operating voltage of each stage of the power controller 100.

Since the power of the output signal of the power controller 100 is relatively high, the power loss after the output signal passed through the power coupler 180 is also relatively high. Thus, a lot of energy may be wasted. Furthermore, since the output power at the last stage is close to the saturated region, it is difficult for the power coupler to correctly detect and control the magnitude of the power. On the other hand, there may be a problem of impedance mismatching caused by the high power loss. Also, the size of the power coupler 180 makes it very difficult for the device using the control system to be reduced in size. Moreover, since the control system only provides an APC signal to the control circuits 150 and 151 of the power controller 100, even though the amplifier possesses high efficiency at high power output, the amplifier cannot possesses high efficiency at low power output. Therefore, the energy is also wasted.

SUMMARY OF THE INVENTION

In view of the above-mentioned problems, it is therefore an object of the invention to provide a power controller having a power detecting unit within the power controller.

It is therefore another object of the invention to provide a power controller capable of detecting the output power without using an external power coupler.

It is therefore still another object of the invention to provide a power controller in which the bias of each of the stage amplifiers can be controlled. Thus, the efficiency of the power controller is high when the power is high and the efficiency of the power controller is high when the power is low.

To achieve the above-mentioned objects, a power controller includes a plurality of stage amplifiers, a plurality of matching circuits, at least one power detector, and a bias control circuit. The stage amplifiers receive emission signals and amplify the power thereof. The matching circuits are connected between the stage amplifiers for matching with the stage amplifiers, respectively. The power detector detects the power of the stage amplifiers and generates detection signals, respectively. The bias control circuit receives the detection signals of the power detector, thereby generating a bias of each of the stage amplifiers in order to optimize the efficiency of each of the stage amplifiers according to the magnitude of the power of each of the stage amplifiers.

BRIEF DESCRIPTION OF THE DRAWINGS

These and other objects and advantages of the present invention will become apparent by reference to the following description and accompanying drawings wherein.

DETAIL DESCRIPTION OF THE INVENTION

The power controller and the power control system using the controller will be described with reference to the accompanying drawings. If only the power outputted from the last stage is detected, since the power is close to the saturated region, it is difficult to detect and control the magnitude of the power. There also may be a problem of impedance mismatching caused by the high power loss. Thus, the object of the invention is to achieve a linear control by way of detecting the power outputted from the first and second stages.

Figure 1:
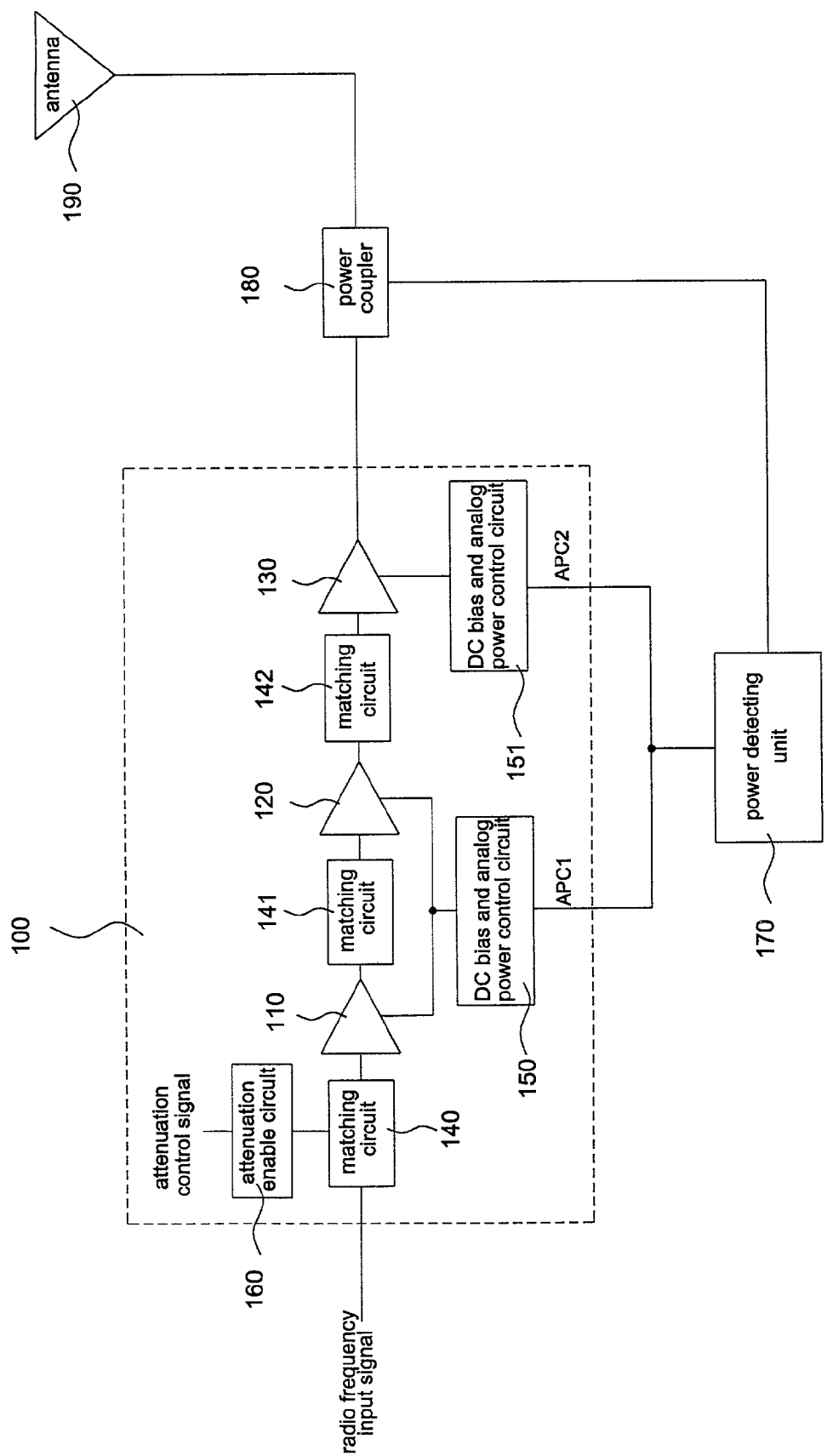
FIG. 1 is a block diagram showing a conventional power control system.
Figure 2:
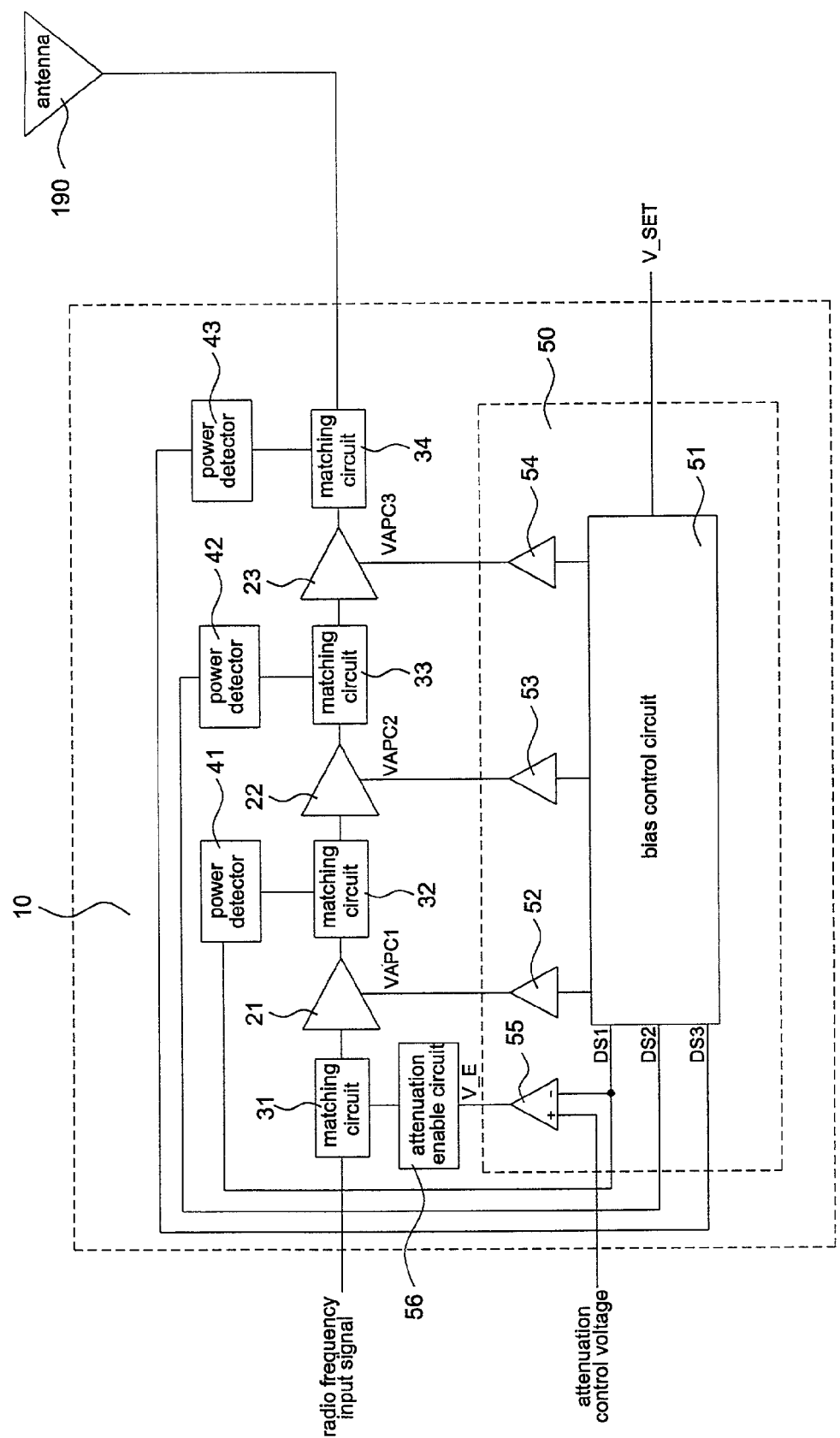
FIG. 2 is a block diagram showing a power control system of the invention.

FIG. 2 is a block diagram showing the power controller of the invention, which is mainly the same as the conventional power controller. The power controller 10 also includes a driver stage amplifier 21, an inter stage amplifier 22, a power stage amplifier 23, and matching circuit 31, 32, 33, and 34. Since the functions of the amplifiers 21 to 23 and the matching circuits 31 to 34 are the same as those of the amplifiers and circuits in the conventional power controller, detailed descriptions thereof are omitted.

In order to obtain the output power of each stage amplifier, the power controller 10 of the invention further includes a plurality of power detectors 41 to 43, which are connected to the matching circuits 32 to 34, respectively. The matching circuits 32 to 34 may be connected to the stage amplifiers, respectively. The power detectors 41 to 43 is used for detecting the output power of each stage amplifier and for generating detection signals DS1 to DS3. According to the detection signals DS1 to DS3 from the power detectors 41 to 43, respectively, the bias control circuit 50 generates three sets of bias signals VAPC1 to VAPC3 that is to be inputted to each stage amplifier. Since the bias control circuit 50 can individually control the operation environment of each stage amplifier, the power controller 10 may be kept at relatively high efficiency regardless of the power range. Of course, although three power detectors 41 to 43 are simultaneously used in this embodiment, only one power detector or two power detectors may also be used according to various designs. For example, it is possible to use only two power detectors 41 and 43, or use two power detectors 41 and 42.

Figure 3:
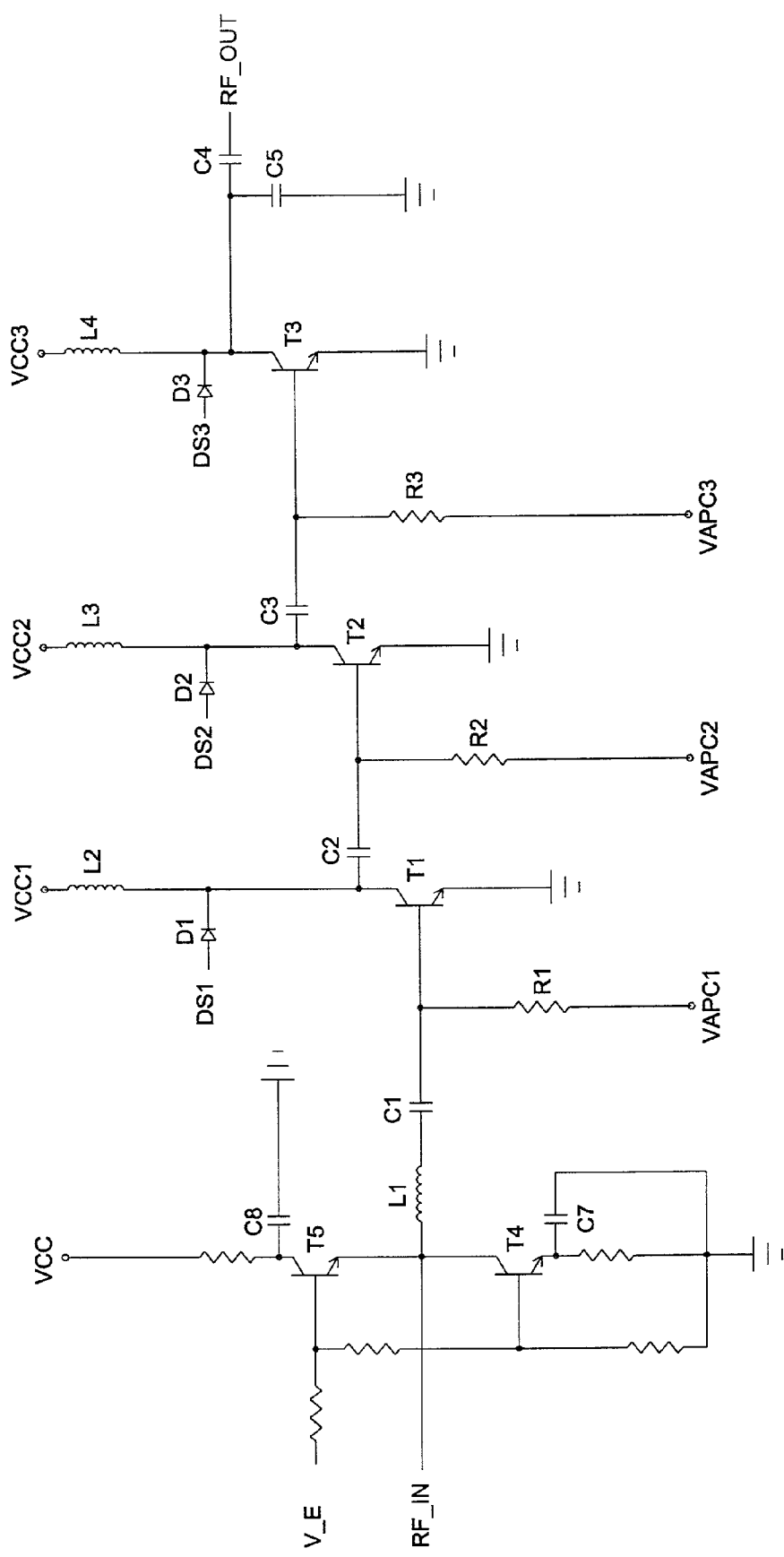
FIG. 3 is a circuit diagram of the power controller as shown in FIG. 2.

FIG. 3 is a partial circuit diagram showing the example of the power controller of FIG. 2. Referring to FIG. 3, transistors are used as the amplifiers in this embodiment. That is, transistors T1 to T3 are used as the element of each stage amplifier. The bias values VAPC1 to VAPC3 of the stages are connected to the bases of the transistors T1 to T3 through the resistors R1 to R3, respectively, for controlling the voltages of the bases of the transistors. As shown in this figure, diodes D1 to D3 are used as the power detectors in this embodiment, and the output signals are detection signals DS1 to DS3. Of course, the elements of power detectors are not limited to diodes. Other elements, such as inductors, resistors, and capacitors connected in series, may be used as the power detectors. Since the power detectors of the invention are directly connected to the matching circuit, the power can be simultaneously detected by the matching action. Therefore, not only the design can be simplified, but also the power loss can be saved.

Referring to FIGS. 2 and 3, the bias control circuit 50 of the power controller 10 of the invention further includes a comparator 55. When the power controller 10 does not output signals, that is, when the output power of the driver stage amplifier 21 is lower than a predetermined threshold value, the comparator 55 outputs an attenuation enable signal V_E to an attenuation enable circuit 56. The implementation circuit of the attenuation enable circuit 56 is shown in FIG. 3. After the attenuation enable circuit 56 receives the attenuation enable signal, the radio frequency signal RF_IN is grounded by the transistors T4 and T5 and through the capacitor. In this case, since the radio frequency signal is not strong enough, it cannot drive the driver stage amplifier 21. Thus, each stage amplifier of the power controller 10 does not output any power, thereby saving the energy.

Since the bias and operation environment of each stage amplifier can be adjusted according to the output power of each stage detected by the power detectors of the controller in the invention, it is possible to obtain high efficiency not only at high power, but also at low power. Furthermore, since the power controller of the invention possesses the function of detecting the power and adjusting the bias by itself, it is not necessary to provide a power coupler to detect the output power in a power control system using the power controller. As a result, the system using the power controller of the invention can be made small, and the power loss can also be saved.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An apparatus for power controlling in a transmitter for receiving an emission signal and outputting to an antenna, comprising:
    a plurality of stage amplifiers for receiving the emission signal and amplifying the power thereof;
    a plurality of matching circuits connected between the stage amplifiers for matching with the stage amplifiers, respectively;
    at least one power detector for detecting the power of the at least one stage amplifier and generating detection signal; and
    a bias control circuit for receiving the detection signal of the at least one power detector, thereby generating a bias of each of the stage amplifiers in order to optimize the efficiency of each of the stage amplifiers according to the magnitude of the power of each of the stage amplifiers;
    wherein the bias control circuit comprises a comparator, thereby outputting a bypass control signal when the power controller is disabled.

2. The apparatus according to claim 1, further comprising a signal bypass unit, thereby grounding the emission signal for preventing the emission signal from being transmitted to each of the stage amplifiers when the bypass control signal is enabled.

3. An apparatus of power controlling in a transmitter for receiving an emission signal and outputting to an antenna, comprising:
    a plurality of stage amplifiers for receiving the emission signal and amplifying the power thereof;
    a plurality of matching circuits connected between the stage amplifiers for matching with the stage amplifiers, respectively;
    a plurality of power detectors for detecting the power of the amplifiers and generating detection signals; and
    a bias control circuit for receiving the detection signals of the power detectors, thereby generating a bias of each of the stage amplifiers in order to optimize the efficiency of each of the stage amplifiers according to the magnitude of the power of each of the stage amplifiers;
    wherein the bias control circuit comprises a comparator, thereby outputting a bypass control signal when the power controller is disabled.

4. The apparatus according to claim 3, further comprising a signal bypass unit, thereby grounding the emission signal for preventing the emission signal from being transmitted to each of the stage amplifiers when the bypass control signal is enabled.

* * * * *